United States Patent
Fischer

(10) Patent No.: US 7,545,482 B2
(45) Date of Patent: Jun. 9, 2009

(54) PROJECTION OBJECTIVE OF A MICROLITHOGRAPHIC PROJECTION EXPOSURE APPARATUS

(75) Inventor: Juergen Fischer, Heidenheim (DE)

(73) Assignee: Carl Zeiss SMT AG, Oberkochen (DE)

( * ) Notice: Subject to any disclaimer, the term of this patent is extended or adjusted under 35 U.S.C. 154(b) by 233 days.

(21) Appl. No.: 11/464,934

(22) Filed: Aug. 16, 2006

(65) Prior Publication Data

US 2007/0036494 A1 Feb. 15, 2007

Related U.S. Application Data

(63) Continuation of application No. PCT/EP2005/000947, filed on Feb. 1, 2005.

(30) Foreign Application Priority Data

Feb. 20, 2004 (DE) .................. 10 2004 008 285

(51) Int. Cl.
*G03B 27/54* (2006.01)
*G03B 27/70* (2006.01)

(52) U.S. Cl. .................. 355/67; 355/53; 355/66; 359/822; 359/846; 359/849

(58) Field of Classification Search .................. 355/67, 355/60, 66, 69; 359/822, 846, 849, 847
See application file for complete search history.

(56) References Cited

U.S. PATENT DOCUMENTS

| 6,307,688 | B1 | 10/2001 | Merz et al. | |
| 6,398,373 | B1 | 6/2002 | Guzman et al. | |
| 6,411,426 | B1 * | 6/2002 | Meehan et al. | 359/291 |
| 6,840,638 | B2 * | 1/2005 | Watson | 359/849 |
| 2002/0089734 | A1 | 7/2002 | Meehan et al. | |

FOREIGN PATENT DOCUMENTS

DE 198 59 634 6/2000

* cited by examiner

*Primary Examiner*—Diane I Lee
*Assistant Examiner*—Steven H Whitesell-Gordon
(74) *Attorney, Agent, or Firm*—Fish & Richardson P.C.

(57) ABSTRACT

A projection objective of a microlithographic projection exposure apparatus has a plurality of optical elements, for example lenses or mirrors. The objective furthermore includes an actuator for exerting a mechanical force that deforms a selected optical element of the projection objective. A manipulator modifies the spatial position of one of the optical elements as a function of the force exerted by the actuator.

23 Claims, 7 Drawing Sheets

PROJECTION OBJECTIVE OF A MICROLITHOGRAPHIC PROJECTION EXPOSURE APPARATUS

CROSS-REFERENCE TO RELATED APPLICATIONS

This is a continuation of International Patent Application PCT/EP2005/000947, which was filed on Feb. 1, 2005 and claims priority of German Patent Application 10 2004 008 285.5 filed Feb. 20, 2004. The full disclosure of these earlier applications is incorporated herein by reference.

BACKGROUND OF THE INVENTION

1. Field of the Invention

The invention relates to a projection objective for microlithographic projection exposure apparatus, such as those used for the production of large-scale integrated electrical circuits and other microstructured components. The invention relates in particular to projection objectives in which at least one optical element can be deformed with the aid of an actuator. The invention furthermore relates to a method for correcting optical properties of such a projection objective.

2. Description of the Prior Art

The purpose of projection objectives in microlithographic projection exposure apparatus is to project a reduced image of structures contained in a mask onto a photosensitive layer, which is applied on a support. Very stringent requirements are placed on the imaging properties of the projection objectives owing to the small size of the structures to be image.

U.S. Pat. No. 6,388,823 assigned to the Applicant discloses a projection objective in which forces can be exerted on an optical element with the aid of actuators, which are distributed around the circumference of the optical element. These forces lead to bending of the optical element which, for example, may be a lens or a mirror. The bending does not affect the thickness profile of the optical element, or at least does not substantially affect it. In particular, astigmatic imaging errors can be corrected with such a bendable optical element.

It has however been found that the bending is not only accompanied by the desired corrective effect; rather, undesired impairment of the imaging properties of the projection objective can also occur. This applies in particular to optical elements which are isostatically mounted. Isostatic mounting means that the optical element is held merely at three mounting points offset by 120° along the circumference.

Such undesired impairment of the imaging properties, however, may also be caused by optical elements which are not bent but otherwise deformed in order to correct imaging errors, as is known per se in the prior art.

SUMMARY OF THE INVENTION

It is an object of the invention to provide a projection objective of a microlithographic projection exposure apparatus, in which such undesired impairment of the imaging due to deliberate deformations of optical elements is substantially avoided.

It is a further object of the invention to provide an improved method for correcting optical properties of a projection objective.

The first object is achieved by a projection objective comprising a plurality of optical elements and at least one actuator, by which a selected optical element of the projection objective can be deformed. According to the invention, the projection objective has at least one manipulator by which the spatial position of one of the optical elements can be modified preferably automatically as a function of a force exerted by at least one actuator.

With respect to the method, the object is achieved in such a projection objective in that the spatial position of one of the optical elements is modified as a function of a force exerted by the at least one actuator.

The invention is based on the discovery that, particularly when the relevant optical element is mounted only at relatively few points as is the case for instance with isostatic mounting, the actuators induce forces which lead not only to a deformation but also to a change in the spatial position of the optical element. The type of position change depends in particular on the points at which the optical element is held and where the forces generated by the actuators engage on the optical element. With isostatic mounting of the optical element in which three mounting points are provided offset by 120° along the circumference, for example, tilting of the optical element takes place about a transverse axis of the optical element when it is bent in a saddle fashion to correct astigmatism. With a different constellation of mounting points of the optical element and actuators engaging thereon, the position change may also consist in a translational displacement of the optical element in a plane perpendicular to the symmetry axis.

However, undesired position changes due to deformations can take place even when the optical element is mounted at very many points. The reasons for this are in general fabrication tolerances and mounting-induced asymmetries.

With the aid of the at least one manipulator according to the invention, it is possible to compensate for the aforementioned position changes of the optical element which lead to impairment of the imaging properties. A single manipulator is not sufficient for this in most cases, so that a plurality of manipulators are to be provided and their effects on the optical element should be appropriately tuned.

The at least one manipulator preferably acts on the selected optical element for which the undesired position change has occurred owing to the deformation. Nevertheless, it is also possible for an optical element other than the deformed optical element to be tilted, displaced or otherwise have its position changed with the aid of the at least one manipulator, so as to compensate for the effects which have been caused by the position change of the selected optical element owing to the deformation.

If both the at least one actuator, which can deform the optical element, and the at least one manipulator, which induces the position change, can be actuated fluidically i.e. hydraulically or pneumatically, then it is preferable for the at least one actuator and the at least one manipulator to be connected to a fluidic pressure system so that they can both be fluidically actuated simultaneously. Specifically, fluidic pressure systems provide the opportunity to make forces act simultaneously at different positions inside the system. With an appropriate design of the pressure system, it is then possible to induce an automatic position change with the at least one manipulator so that, when the at least one actuator is actuated, the at least one manipulator without its own additional control or regulation applies the required force which leads to the desired position change of the optical element.

One possibility for simultaneous actuation of the at least one actuator and the at least one manipulator consists in designing the pressure system so that changes in the fluid pressure applied to the actuator lead to corresponding changes in the fluid pressure applied to the manipulator. For example, this may be done by connecting the manipulator in parallel with the actuator in the pressure system.

In a particularly preferred configuration of the invention a resilient compensating element, whose deformations caused by pressure fluctuations can be transmitted via a transmission element to the at least one manipulator, is integrated into a pressure line leading to the at least one actuator. The manipulator will in this way be actuated not by changes in the fluid pressure in the pressure line, but mechanically via the transmission element which is coupled to the compensating element. The purpose of the resilient compensating element, which may for example be a kind of bellows, is to decouple the actuator from supply devices of the pressure system and the housing of the projection objective so that vibrations cannot be transmitted onto the selected optical element. Since pressure changes in such a compensating element lead to deformations and therefore to movements, a mechanical force which can be used for the position change of the one optical element with the aid of the at least one manipulator can be derived from the compensating element or the pressure line connected to it.

If such transmission of forces from the compensating element to the at least one manipulator is not provided, then it may be expedient to improve the decoupling of the pressure line from the optical element by integrating a plurality of resilient compensating elements in a pressure line, which are arranged relative to one another so that the deformation forces formed therein in the event of a pressure change mutually compensate least substantially. Deformation forces which act in the event of a pressure change in a compensating element cannot therefore be undesirably transmitted to the optical element. This force-free connection of the optical element to a supply device of the pressure system may also advantageously be used independently of the manipulators according to the invention.

Such an arrangement can be produced most simply if two compensating elements, connected together to a pressure feed line and together to a pressure discharge line, are arranged lying diametrically opposite each other. Merely one additional compensating element is required in such an arrangement.

The at least one manipulator itself may engage directly on the optical element or, alternatively, it may engage thereon via a mounting which contains the selected optical element. If the at least one manipulator engages on the mounting, then when the at least one manipulator is actuated this leads to a relative movement between the mounting and the optical element contained in it, on the one hand, and the housing of the objective on the other hand.

If the mounting is in turn supported in a frame, which is fixed relative to the housing of the objective, then the at least one manipulator may also engage on such a frame. In this way, the mounting of the optical element in the mounting is not affected by the at least one manipulator.

Instead of a fluidic pressure system, the at least one actuator and/or the at least one manipulator may of course also be actuated with the aid of other controlling elements. For example, precisely adjustable forces may be exerted with the aid of piezoelectric elements. In this case, it is generally necessary to provide a control or regulating device for driving the at least one actuator and/or the at least one manipulator.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EXEMPLARY EMBODIMENTS

Figure 1:
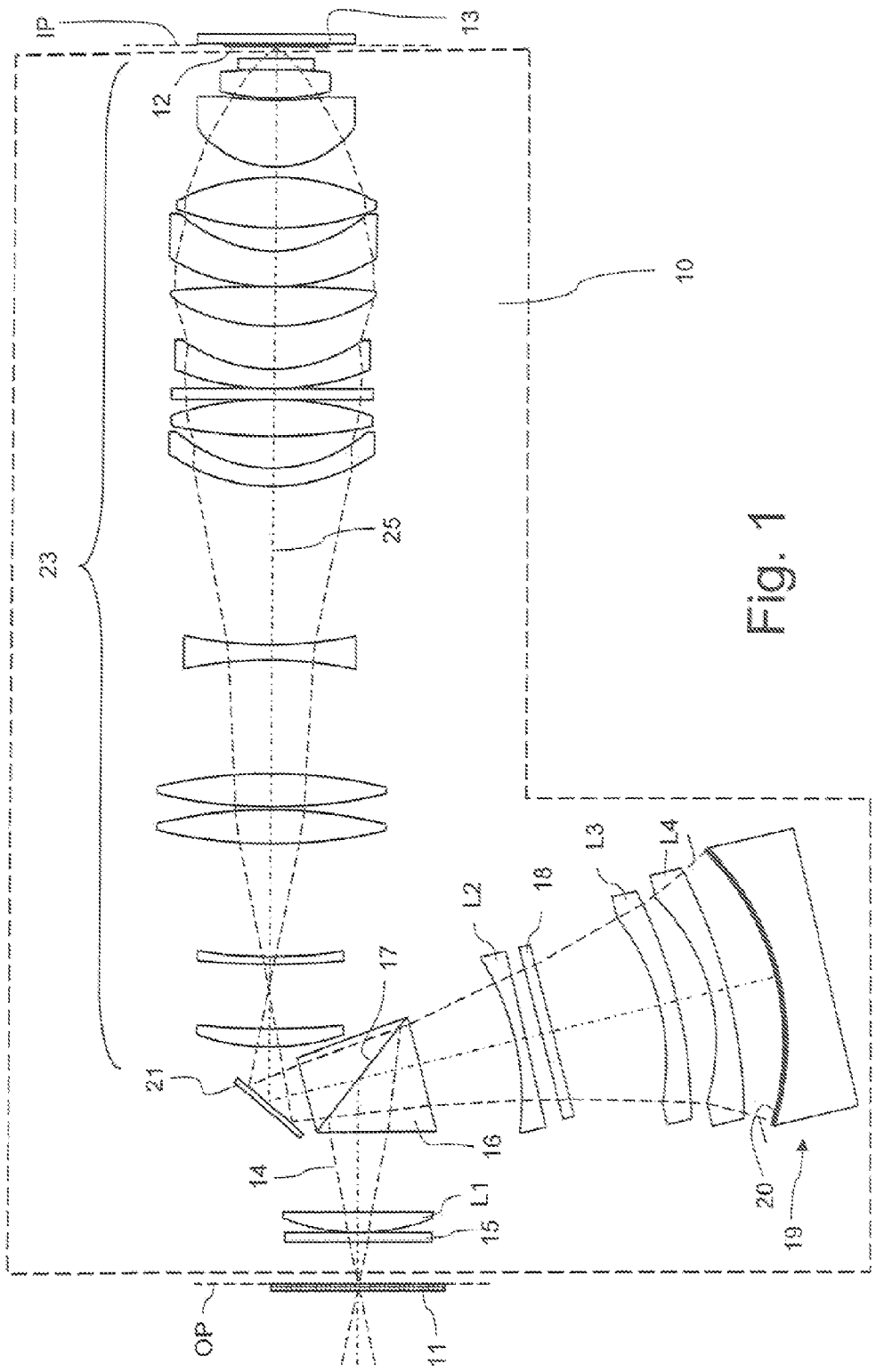
FIG. 1 shows a catadioptric projection objective of a microlithographic exposure apparatus having a mirror unit in a meridian section.

FIG. 1 shows a simplified representation of a meridian section through a projection objective, denoted overall by 10, of a microlithographic projection exposure apparatus. The projection objective, which is also described in PCT/EP03/04015 assigned to the Applicant, is used to project a reduced image of structures contained in a reticle 11 onto a photosensitive layer 12, which consists of a photoresist and is applied on a substrate 13. The reticle 11 is arranged in an object plane OP and the photosensitive layer 12 is arranged in an image plane IP of the projection objective 10.

After passing through the reticle 11, projection light 14 indicated by dashes in FIG. 1 which is generated by an illuminating device of the projection exposure apparatus and has a wavelength of 157 nm in the exemplary embodiment represented, travels through a plane-parallel plate 15 and a lens L1 into a beam splitter cube 16. There, the projection light 14 is reflected by a polarisation-selective beam splitter layer 17 contained in it and sent through a lens L2, a quarter-wave plate 18 and two further lenses L3 and L4 onto a mirror unit 19 having a spherical mirror 20 and a mounting, which will be explained in more detail below.

After reflection by the spherical mirror 20, the projection light 14 passes back through the lenses L4 and L3, the quarter-wave plate 18 and the lens L2, and strikes the polarisation-selective beam splitter layer 17. There, however, the projection light 14 is not reflected but transmitted since the polarisation of the projection light 14 has been rotated through 90° by the double transit through the quarter-wave plate 18. From the beam splitter cube 16, the projection light 14 travels via a plane mirror 21 into a purely dioptric parts 23 of the projection objective 10, in which refractive optical elements (not denoted in detail) are arranged along an optical axis indicated by 25.

Figure 2:
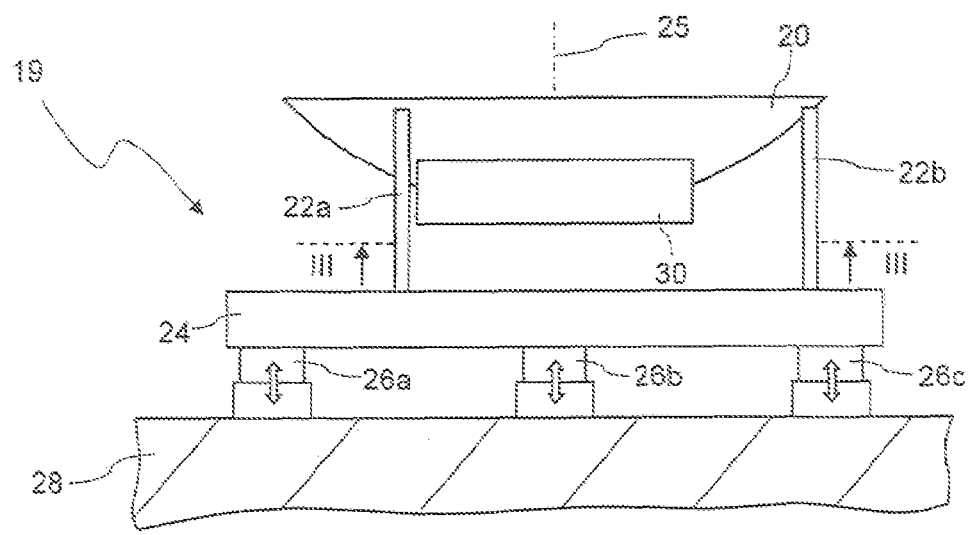
FIG. 2 shows a side view of the mirror unit for the projection objective shown in FIG. 1 according to a first exemplary embodiment in an enlarged, highly schematised representation.
Figure 3:
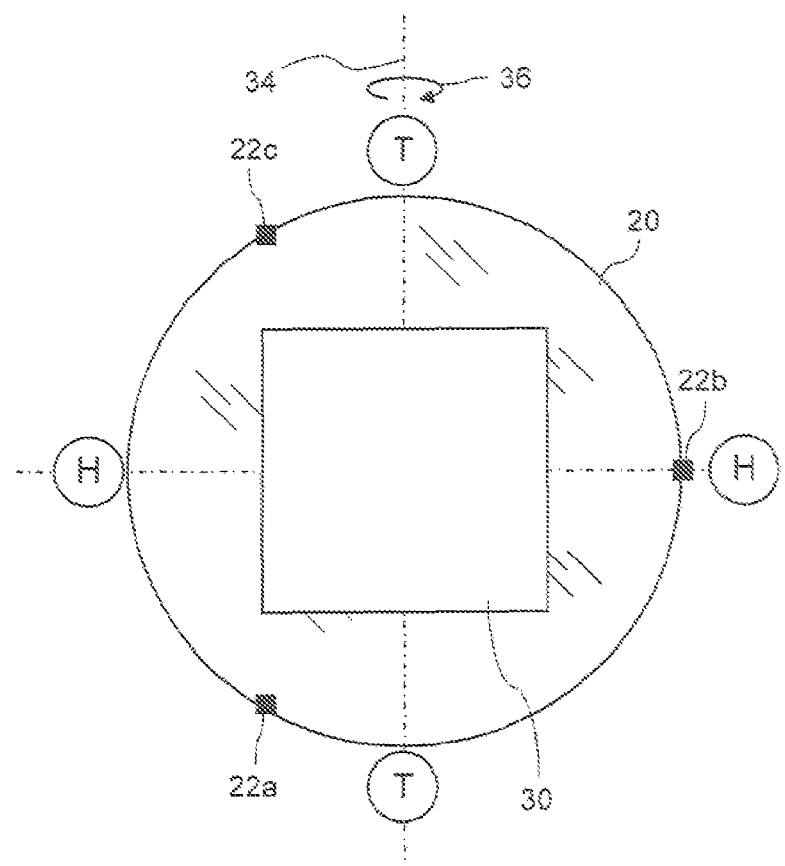
FIG. 3 shows a section along the line III-III of the mirror unit shown in FIG. 2.

FIGS. 2 and 3 give a highly schematised representation of the mirror unit 19 for the projection objective 10 according to a first exemplary embodiment, respectively in a side view and a horizontal section along the line III-III. The mirror 20 of the mirror unit 19 is contained in an isostatic mounting, which is formed by three mounting units 22a, 22b and 22c. The mounting units 22a, 22b and 22c are distributed at intervals of 120° over the circumference of the mirror 20, as can be seen in FIG. 3. Owing to the isostatic mounting, the mirror 20 is contained stiffly but nevertheless almost force-free in the mounting. Possible designs for the mounting units 22a, 22b, 22c are known in the prior art, see for example EP 1 245 982 A2, which corresponds to US Pat. Appl. 2002/0176094 A1.

The mounting units 22a, 22b, 22c are fastened on a frame 24 which, for example, may have a circularly round base shape. For the isostatic mounting described here, it is nevertheless also conceivable to use a triangular base shape as likewise known from the aforementioned EP 1 245 982 A2.

The frame 24 is fixed relative to a housing 28 of the projection objective 10 via three manipulators 26a, 26b and 26c, which are arranged at the vertices of an imaginary equilateral triangle. The manipulators 26a to 26c in the exemplary embodiment represented respectively comprise two hydraulically telescopable cylinders, so that the length of the manipulators 26a to 26c can be mechanically varied. With appropriate driving of the manipulators 26a to 26c, the frame 24 can be tilted relative to the housing 28 about any axis perpendicular to the optical axis 25 of the projection objective 10.

An actuator unit denoted overall by 30, by which the mirror 20 can be bent, is arranged on the lower side of the mirror 20. To this end, the actuator unit 30 comprises a plurality of individual actuators (not shown because they are known per se) which are arranged around the optical axis 25. The actuator unit 30 may be designed so that the individual actuators act on the mirror 20 from the circumference. Possible embodiments of an actuator unit 30 having a plurality of individual actuators can be found in DE 198 59 634 A1, which corresponds to U.S. Pat. No. 6,307,688, and DE 198 27 603 A1, which corresponds to U.S. Pat. No. 6,388,823.

In the exemplary embodiment represented, it is assumed that a second-order astigmatism can be corrected with the aid of the actuator unit 30. To this end, the individual actuators contained in the actuator unit 30 should engage on the mirror 20 so that the mirror 20 is bent in a saddle fashion owing to the bending moments thereby generated. This saddle-like bending is indicated in FIG. 3 by circled capital letters H and T. Circles containing a letter H indicate positions on the mirror 20 which lie uppermost, in so far as they are furthest away from the frame 24. Circles containing a letter T indicate positions which lie lowermost and are thus at the smallest distance from the frame 24.

In order to generate such saddle-like bending, the individual actuators of the actuator unit 30 may be arranged and actuated so that compressive forces in the direction of the optical axis 25 are generated at two points lying opposite each other at an angle of 180°, whereas oppositely directed forces act on the mirror 20 at two points respectively offset by angles of 90° thereto.

As can be seen clearly from FIG. 3, such forces in the isostatic mounting as shown lead to tilting of the mirror 20 about a horizontal axis 34, which extends through the lower-lying points T. The direction of the tilting is indicated by an arrow 36 in FIG. 3. The reason for the tilting is the fact that the two-fold symmetry of the forces cannot be made to match the three-fold symmetry of the mounting in the mounting units 22a, 22b, 22c. With mounting at four suitably selected points, this tilting would not occur. Mounting at four points, however, is known to be disadvantageous in many respects compared to isostatic mounting.

The tilting about the axis 34 is absorbed by the mounting units 22a to 22c which, to this end, may have resilient properties as described in EP 1 245 982 A2, which corresponds to US Pat. Appl. 2002/0176094 A1.

Figure 4:
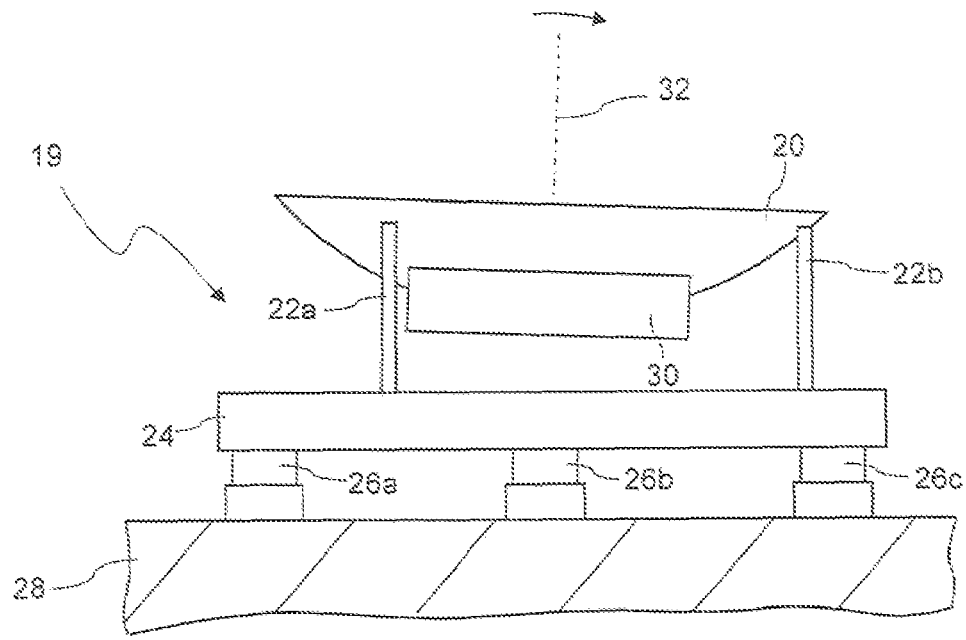
FIG. 4 shows the mirror unit shown in FIG. 2, but with tilting due to bending generated by actuators.

FIG. 4 shows the mirror 20 in a side view corresponding to FIG. 2, although the mirror 20 is tilted about the axis 34 in the aforementioned way owing to the saddle-like bending (which cannot be seen in FIG. 4). The symmetry axis 32 of the mirror 20, which normally coincides with the optical axis 25 of the projection objective 20, is offset by the tilt angle relative to the original setpoint position owing to the tilting. This tilt angle is represented very exaggeratedly for the sake of clarity.

Figure 5:
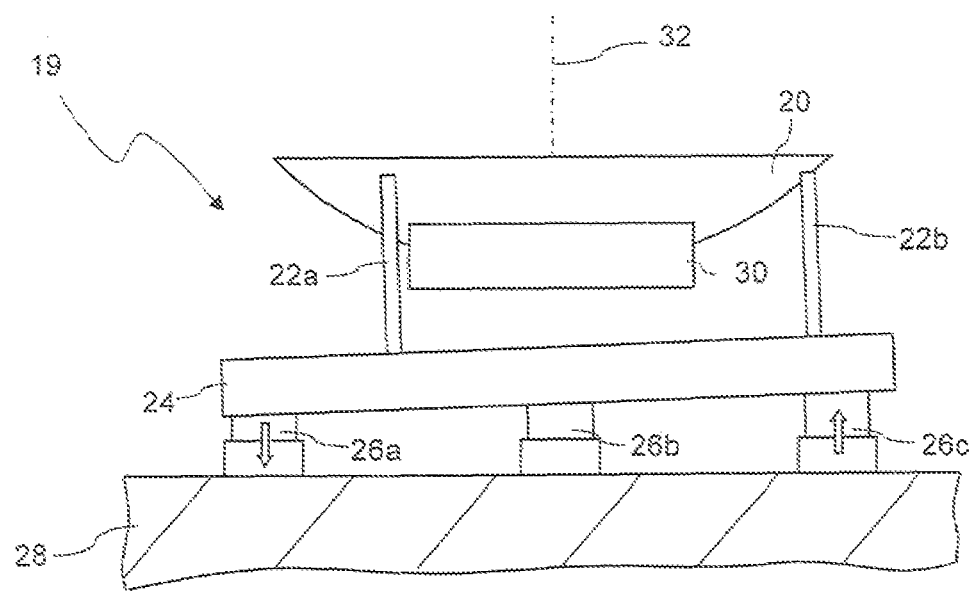
FIG. 5 shows the mirror unit shown in FIG. 4, in which the tilting is rectified by manipulators.

The three manipulators 26a to 26c are now driven so that the tilted symmetry axis 32 of the mirror 20 is returned to its setpoint position which is vertical in FIG. 4. To this end, the manipulators 26a to 26c which are arranged outside the tilting axis are adjusted so that the entire frame 24, including the mounting units 22a to 22c fastened therein and the mirror 20 contained therein, is tilted back by the required compensating angle. In magnitude, this compensating angle coincides with the tilt angle by which the mirror 20 is tilted relative to the frame 24 during the bending. Owing to the compensatory tilting generated by the three manipulators 26a to 26c, as can be seen clearly in FIG. 5, the symmetry axis 32 of the mirror 20 even after it is bent lies in the setpoint position pointing vertically upwards in FIG. 5. The tilting of the mirror 20 in the mounting units 22a to 22c, as generated by the bending, does not therefore impair the imaging properties of the mirror 20.

Figure 6:
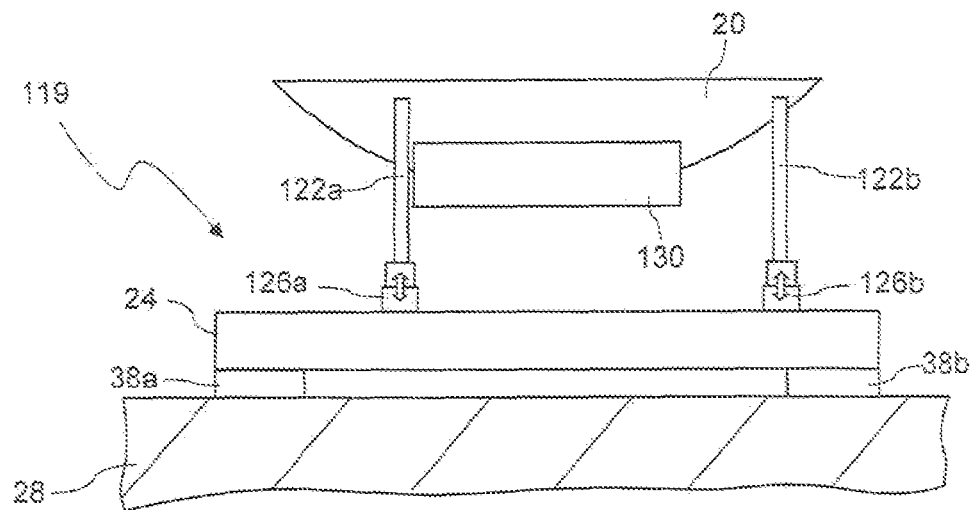
FIG. 6 shows a side view of the mirror unit for the projection objective shown in FIG. 1 according to a second exemplary embodiment in an enlarged, highly schematised representation.

FIG. 6 shows a mirror unit 119 suitable for the projection objective 10 according to a second exemplary embodiment. Parts which are the same as in the exemplary embodiment described above are denoted by the same reference numerals, and parts corresponding to one another are denoted by reference numerals increased by 100.

In the mirror unit 119, it is not the frame 24 but only the mirror 20 which is correspondingly tilted in order to compensate for tilting movements due to bending. To this end, a manipulator 126a or 126b which can adjust the lengths of the three mounting units is respectively integrated into two mounting units 122a, 122b and a third mounting unit (concealed by the mounting unit 122b in FIG. 6). The frame, however, is firmly connected to the housing 28 via connecting elements 38a, 38b. In order to rectify the tilting of the mirror 20, as represented in FIG. 4 for the mirror unit 19, the manipulator 126a and the manipulator lying behind it (not visible in FIG. 6) should be retracted and the manipulator 126b should be deployed, so that their lengths are respectively reduced and increased.

Figure 7:
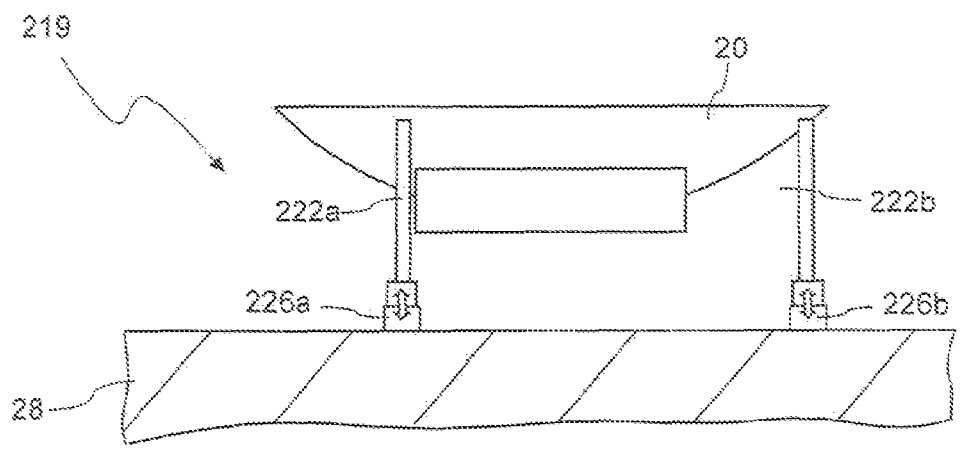
FIG. 7 shows a side view of the mirror unit for the projection objective shown in FIG. 1 according to a third exemplary embodiment in an enlarged, highly schematised representation

FIG. 7 shows a mirror unit 219 suitable for the projection objective 10 according to a third exemplary embodiment. Parts which are the same as in the mirror unit 19 are denoted by the same reference numerals, and parts corresponding to one another are denoted by reference numerals increased by 200.

The mirror unit 219 represented in FIG. 7 differs from the mirror unit 119 represented in FIG. 6 merely in that mounting units 222a, 222b are fastened directly via manipulators 226a, 226b, i.e. without an interposed frame 24, on the housing 28 of the projection objective 10.

Figure 8:
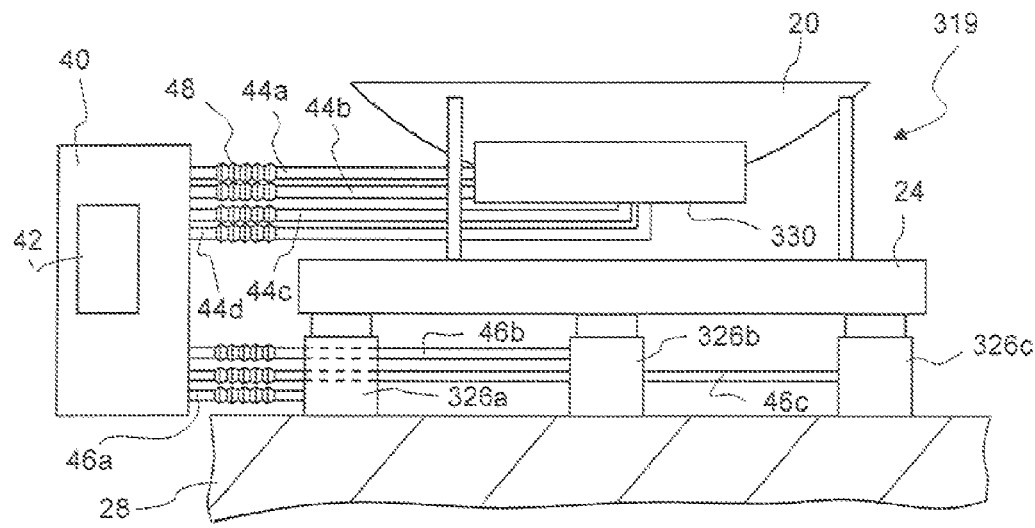
FIG. 8 shows the mirror unit shown in FIGS. 1 to 5 with a hydraulic system.

FIG. 8 shows a mirror unit 319 suitable for the projection objective 10 according to a fourth exemplary embodiment. Parts which are the same as in the mirror unit 19 are denoted by the same reference numerals, and parts corresponding to one another are denoted by reference numerals increased by 300.

The mirror unit 319 corresponds essentially to the mirror unit 19 as represented in FIG. 2. A hydraulic device 40 for supplying a hydraulic liquid to an actuator unit 330 and manipulators 326a, 326b, 326c is also shown.

The hydraulic device 40 contains a controller 42 which, via valves (in a manner not represented in detail), controls the pressure of the hydraulic liquid which is used to actuate the individual actuators contained in the actuator unit 30 and the manipulators 26a, 26b, 26c. To this end, in the mirror unit 319, the four individual actuators contained in the actuator unit 30 are connected to the hydraulic device 40 via respectively independent first pressure lines 44a to 44d.

The hydraulic device 40 is furthermore connected via second pressure lines 46a, 46b and 46c to the manipulators 326a, 326b, 326c. A compensating element 48 in the form of a bellows is integrated into each of the first and second pressure lines 44a to 44d and 46a to 46c. The purpose of the compensating element is to decouple the hydraulic device 40 from the actuator unit 330 and the manipulators 326a to 326c so that vibrations, which are caused in the hydraulic device 40 by valves or pumps contained therein or by the projection objective housing 28 connected thereto, cannot be transmitted to the mirror 20 via the first and second pressure lines 44a to 44d and 46a to 46c.

The controller 42 of the hydraulic device 40 is designed so that actuation of the actuator unit 330 is accompanied by synchronous actuation of the manipulators 326a to 326c. To this end, the controller 42 accesses a stored table in which the setpoint excursions of the manipulators 326a to 326c, which are necessary so that the tilting of the mirror 20 due to the bending caused by the actuator unit 330 can be rectified again, are stored for a multiplicity of settings of the individual actuators contained in the actuator unit 330.

Figure 9:
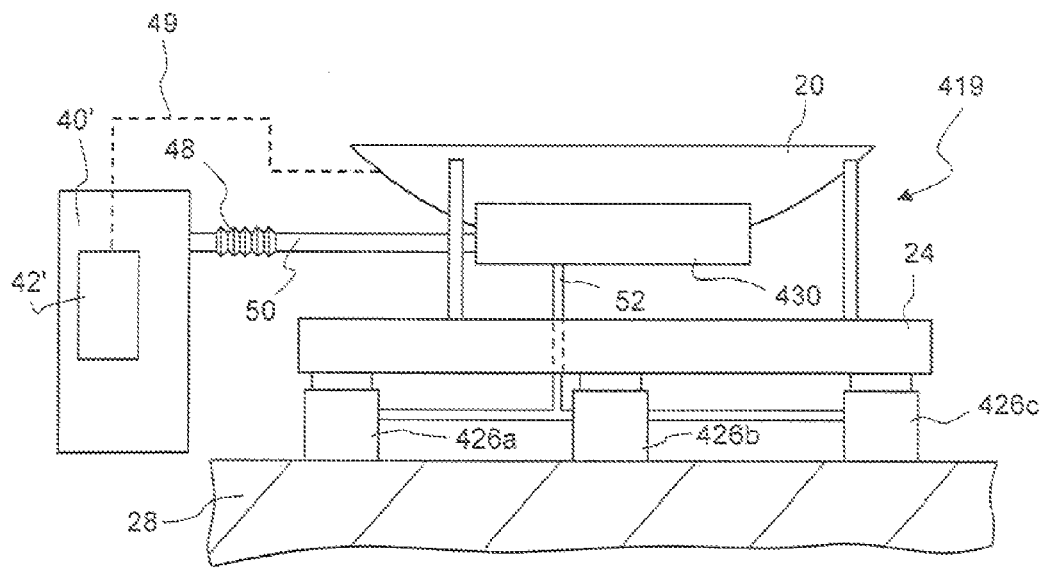
FIG. 9 shows the mirror unit shown in FIGS. 1 to 5 with another hydraulic system.

FIG. 9 shows a mirror unit 419 suitable for the projection objective 10 according to a fifth exemplary embodiment. Parts which are the same as in the mirror unit 19 are denoted by the same reference numerals, and parts corresponding to one another are denoted by reference numerals increased by 400.

The mirror unit 419 differs from the mirror unit 319 shown in FIG. 8 inter alia in that the controller 42 is replaced by a regulator 42', which is connected via a line 49 (represented by dashes) to position sensors which record the spatial position of the mirror 20. Furthermore, only one pressure line 50 leads from the hydraulic device 40' to the actuator unit 430. The latter is connected via a further pressure line 52 in series with manipulators 426a to 426c. Any pressure change in the pressure line 50 therefore leads to a corresponding pressure change in the actuator unit 430 and in the manipulators 426a to 426c. The effect which can be achieved via correspondingly preset valves, which are assigned to the individual actuators of the actuator unit 430 and to the manipulators 426a to 426c, is to set up the desired deformation of the mirror 20 as well as simultaneously tilting of the frame 24 relative to the housing 28 merely by changing the pressure of the hydraulic liquid in the pressure line 50. Although the actuator unit 430 and the manipulators 426a to 426c can therefore no longer be controlled independently of one another, the control of the mirror unit 419 is thereby greatly simplified.

Figure 10:
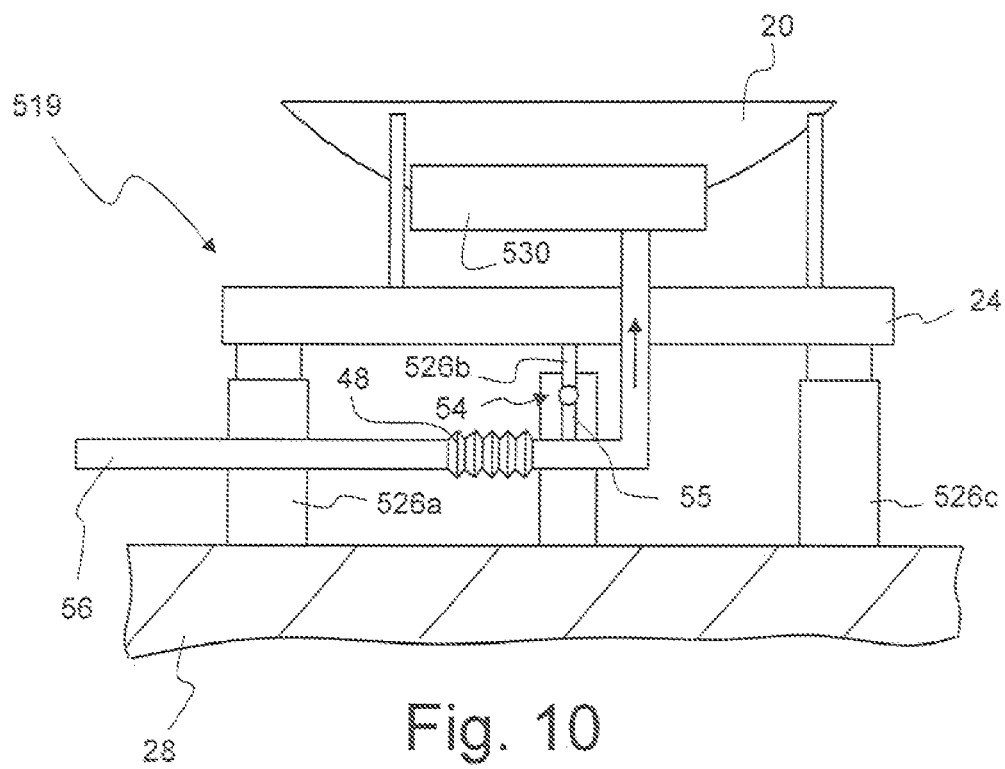
FIG. 10 shows the mirror unit shown in FIGS. 1 to 5 with a further hydraulic system in the undeformed state.
Figure 11:
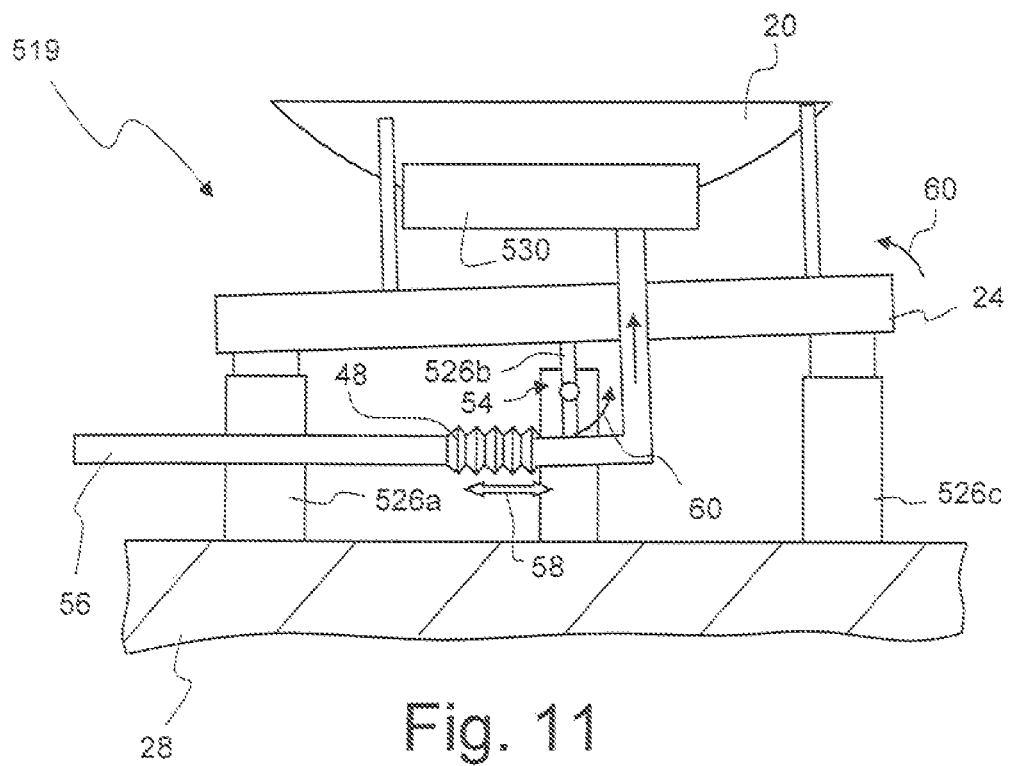
FIG. 11 shows the mirror unit shown in FIG. 10 in the deformed state with tilting correction.

FIGS. 10 and 11 show a mirror unit 519 suitable for the projection objective 10 according to a sixth exemplary embodiment, respectively with an unbent mirror and a bent mirror. Parts which are the same as in the mirror unit 19 are denoted by the same reference numerals, and parts corresponding to one another are denoted by reference numerals increased by 500.

In the mirror unit 519, only the manipulator 526b is actively configured. The other two manipulators 526a and 526c, on the other hand, are passively configured. This means that the manipulators 526a, 526c can in turn accomplish length changes only passively; an active length change, for example by varying an applied hydraulic pressure, is not possible.

The active manipulator 526b consists essentially of the upper arm of a lever mechanism 54, the lower arm 55 of which is coupled to a pressure line 56 which connects a pressure device (not shown) to an actuator unit 530.

When the pressure of the hydraulic liquid in the pressure line 56 increases in order to actuate the individual actuators contained in the actuator unit 530, this leads to an extension of the resilient compensating element 48 as indicated by a double arrow 58 in FIG. 11. Via the lever mechanism 54, this extension 58 is converted into a tilting movement of the frame 24 in the direction indicated by arrows 60. The frame 24 is thereby automatically tilted in the desired way each time the mirror 20 bends, without additional control or regulating devices. It is readily possible to adapt the tilt angle by appropriately configuring the lever mechanism 54.

Figure 12:
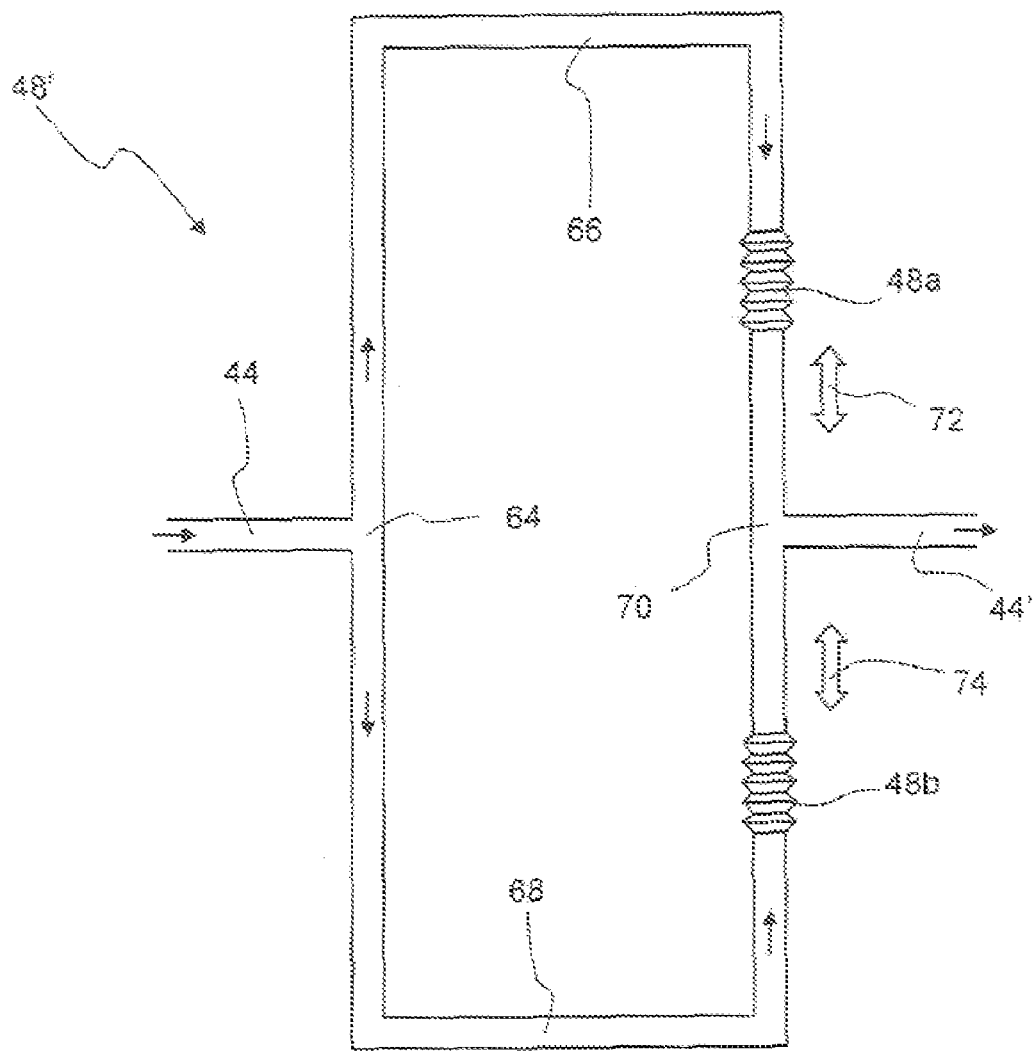
FIG. 12 shows a compensating unit for force-free connection of a mirror unit to a housing via a pressure line.

If the tilting movement generated by manipulators is intended to be controllable independently of the actuator unit 30, as is the case in the mirror unit 319 according to FIG. 8, then it is advantageous to replace the compensating elements 48 in the first and second pressure lines 44a to 44d and 46a to 46c respectively by a compensating unit 48' as represented in FIG. 12. The compensating unit 48' contains a first T-piece 64, which divides a pressure line 44 into two parallel pressure lines 66, 68. A compensating element 48a or 48b is respectively integrated into each of the parallel pressure lines 66, 68, and specifically so that the compensating elements 48a, 48b lie opposite each other. Via a second T-piece 70, the parallel pressure lines 66, 68 are recombined into a pressure line 44' downstream of the compensating elements 48a, 48b.

Since the compensating elements 48a, 48b lie symmetrically opposite each other, length changes of the compensating elements 48a, 48b as indicated by double arrows 72, 74 do not lead to a force in the longitudinal direction of the pressure line 44' leading off from the second T-piece 70. The take-off through the second T-piece 70, lying between the two compensating elements 48a, 48b, thus induces a force equilibrium which prevents undesired controlling forces from propagating via the pressure line 44' and an actuator unit and/or a manipulator to the mirror 20.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A projection objective of a microlithographic projection exposure apparatus, comprising:
   a) a plurality of optical element,
   b) at least one actuator configured to exert a mechanical force that deforms a selected optical element of the projection objective,
   c) at least one manipulator coupled to one of the optical elements and configured to modify a spatial position of the one of the optical elements-when the manipulator is driven; and
   d) a device adapted to drive the at least one manipulator as a function of the force exerted by the at least one actuator,
   wherein the at least one manipulator is fluidically actuated.

2. The objective of claim 1, wherein the at least one manipulator is configured to automatically modify the spatial position of the one of the optical elements.

3. The objective of claim 1, wherein the at least one manipulator is configured to tilt the one optical element about an axis that is substantially perpendicular to a symmetry axis of the one optical element.

4. The objective of claim 1, wherein the at least one manipulator is configured to displace the one optical element in a plane that is substantially perpendicular to a symmetry axis of the one optical element.

5. The objective of claim 1, wherein the one optical element whose spatial position is modified is the selected optical element that is deformed by the actuator.

6. The objective of claim 1, wherein the at least one actuator is fluidically actuated.

7. The objective of claim 6, wherein the at least one actuator and the at least one manipulator are connected to a fluidic pressure system which is configured to fluidically actuate the at least one actuator and the at least one manipulator simultaneously.

8. The objective of claim 7, wherein the fluidic pressure system is configured such that changes in the fluid pressure applied to the at least one actuator result in changes in the fluid pressure applied to the at least one manipulator.

9. The objective of claim 8, wherein the at least one manipulator is connected in series with the at least one actuator in the fluidic pressure system.

10. The objective of claim 1, wherein the device adapted to drive the at least one manipulator comprises a regulator that regulates position changes of the one optical element as a function of the force exerted by the at least one actuator.

11. The objective of claim 1, wherein the device adapted to drive the at least one manipulator comprises a controller for controlling position changes of the one optical element as a function of the force exerted by the at least one actuator.

12. The objective of claim 6, comprising a pressure line, which leads to the at least one actuator, and a resilient compensating element, which is integrated into the pressure line, wherein deformations of the compensating element caused by pressure fluctuations are transmitted via a transmission element to the at least one manipulator.

13. The objective of claim 1, wherein the at least one manipulator engages directly on the one optical element.

14. The objective of claim 1, wherein the at least one manipulator engages on a mounting containing the one optical element.

15. The objective of claim 1, wherein the at least one manipulator engages on a frame on which a mounting containing the one optical element is supported.

16. The objective of claim 6, comprising a pressure line, which leads to the at least one actuator, and a plurality of resilient compensating elements, which are integrated in the pressure line and are arranged relative to one another so that deformation forces in the compensating elements caused by pressure changes mutually compensate at least substantially.

17. The objective of claim 16, wherein two compensating elements are connected together to a pressure feed line and together to a pressure discharge line such that they are arranged diametrically opposite each other.

18. The projection objective of claim 1, wherein the device adapted to drive the at least one manipulator comprises a pressure line connected to the at least one actuator, and the manipulator comprises a lever mechanism coupled to the pressure line.

19. The projection objective of claim 18, wherein the lever mechanism is coupled to the pressure line in a manner such that the lever mechanism moves when pressure within the pressure line changes.

20. The projection objective of claim 10, wherein a controller is in communication with a look up table comprising a first set of data related to positions of the at least one manipulator and a second set of data related to forces exerted by the at least one actuator, and the controller is adapted to use the first and second sets of data to drive the at least one manipulator.

21. A projection objective of a microlithographic projection exposure apparatus, comprising:
   a) a plurality of optical elements,
   b) at least one actuator configured to exert a mechanical force that deforms a selected optical element of the projection objective, and
   c) at least one manipulator configured to modify a spatial position of one of the optical elements as a function of the force exerted by the actuator, wherein the at least one manipulator is fluidically actuated.

22. A projection objective of a microlithographic projection exposure apparatus, comprising:
   a) a plurality of optical elements,
   b) at least one actuator configured to exert a mechanical force that deforms a selected optical element of the projection objective,
   c) at least one manipulator coupled to one of the optical elements and configured to modify a spatial position of the one of the optical elements when the manipulator is driven;
   d) a device adapted to drive the at least one manipulator as a function of the force exerted by the at least one actuator;
   e) a pressure line, which leads to the at least one actuator, and
   f) a plurality of resilient compensating elements, which are integrated in the pressure line and are arranged relative to one another so that deformation forces in the compensating elements caused by pressure changes mutually compensate at least substantially,
   wherein the at least one actuator is fluidically actuated, and two compensating elements are connected together to a pressure feed line and together to a pressure discharge line such that they are arranged diametrically opposite each other.

23. A projection objective of a microlithographic projection exposure apparatus, comprising:
   a) a plurality of optical elements,
   b) at least one actuator configured to exert a mechanical force that deforms a selected optical element of the projection objective, c) at least one manipulator coupled to one of the optical elements and configured to modify a spatial position of the one of the optical elements when the manipulator is driven;
d) a device adapted to drive the at least one manipulator as a function of the force exerted by the at least one actuator; and
e) a controller is in communication with a look up table comprising a first set of data related to positions of the at least one manipulator and a second set of data related to forces exerted by the at least one actuator, and the controller is adapted to use the first and second sets of data to drive the at least one manipulator,
wherein the device adapted to drive the at least one manipulator comprises a regulator that regulates position changes of the one optical element as a function of the force exerted by the at least one actuator.

* * * * *

UNITED STATES PATENT AND TRADEMARK OFFICE
CERTIFICATE OF CORRECTION

PATENT NO. : 7,545,482 B2  Page 1 of 1
APPLICATION NO. : 11/464934
DATED : June 9, 2009
INVENTOR(S) : Juergen Fischer It is certified that error appears in the above-identified patent and that said Letters Patent is hereby corrected as shown below:

Column 4, line 29-30, after "representation" insert --;--.

Column 9, line 6, Claim 1, delete "element" insert --elements--.

Signed and Sealed this

Fourth Day of August, 2009

JOHN DOLL
*Acting Director of the United States Patent and Trademark Office*